US008483995B2

(12) United States Patent
Kunkee et al.

(10) Patent No.: US 8,483,995 B2
(45) Date of Patent: Jul. 9, 2013

(54) COMPUTERIZED TOOL AND METHOD FOR THE AUTOMATED CREATION OF A CUTTER RAMP CURVE

(75) Inventors: Duane Kunkee, Florissant, MO (US); Eric Delph, St. Peters, MO (US); John F. Enberg, Jr., Bridgeton, MO (US)

(73) Assignee: The Boeing Company, Chicago, IL (US)

( * ) Notice: Subject to any disclaimer, the term of this patent is extended or adjusted under 35 U.S.C. 154(b) by 93 days.

(21) Appl. No.: 12/962,336

(22) Filed: Dec. 7, 2010

(65) Prior Publication Data
US 2011/0077914 A1 Mar. 31, 2011

Related U.S. Application Data

(63) Continuation of application No. 11/187,764, filed on Jul. 21, 2005, now Pat. No. 7,881,909.

(51) Int. Cl.
*G06F 17/50* (2006.01)
(52) U.S. Cl.
USPC .................................................. 703/1
(58) Field of Classification Search
USPC .................................................. 703/1
See application file for complete search history.

(56) References Cited

U.S. PATENT DOCUMENTS

| | | | |
|---|---|---|---|
| 6,632,053 B2 * | 10/2003 | Koch ........................... 409/132 |
| 7,032,426 B2 | 4/2006 | Durney et al. |
| 7,152,449 B2 | 12/2006 | Durney et al. |
| 7,155,673 B2 | 12/2006 | Stewart et al. |
| 7,174,225 B2 | 2/2007 | Dolansky |
| 7,440,874 B2 | 10/2008 | Durney et al. |
| 7,881,909 B2 | 2/2011 | Kunkee et al. |
| 2002/0133264 A1* | 9/2002 | Maiteh et al. ................. 700/182 |
| 2005/0005670 A1 | 1/2005 | Durney et al. |

OTHER PUBLICATIONS

Appeal brief dated May 2, 2008 regarding U.S. Appl. No. 11/187,764, 27 Pages.
Board of Patent Appeals decision on appeal dated Jul. 21, 2010 regarding U.S. Appl. No. 11/187,764, 8 Pages.
Examiner's answer dated Jul. 24, 2008 regarding U.S. Appl. No. 11/187,764, 14 Pages.
Final office action dated Dec. 12, 2007 regarding U.S. Appl. No. 11/187,764, 9 Pages.
Non-final office action dated Jun. 28, 2007 regarding U.S. Appl. No. 11/187,764, 11 Pages.
Notice of allowance dated Nov. 22, 2010 regarding U.S. Appl. No. 11/187,764, 13 Pages.
Reply brief dated Sep. 9, 2008 regarding U.S. Appl. No. 11/187,764, 12 Pages.
Response to office action dated Sep. 26, 2007 regarding U.S. Appl. No. 11/187,764, 10 Pages.
Mathematisch Technische "Topcam Topturn Topmill", 12 pages.

* cited by examiner

*Primary Examiner* — Suzanne Lo
(74) *Attorney, Agent, or Firm* — Yee & Associates, P.C.

(57) ABSTRACT

An automated and computerized technique as disclosed herein can be utilized to generate a modeled cutter ramp curve for a flange component. The technique can be utilized in conjunction with any suitable CAD system to render a cutter ramp curve on the modeled flange component. The system obtains a selected amount of user inputs, verifies that the user inputs are consistent with the geometry of the flange component, and generates the cutter ramp curve in response to the user inputs and the flange geometry.

18 Claims, 8 Drawing Sheets

COMPUTERIZED TOOL AND METHOD FOR THE AUTOMATED CREATION OF A CUTTER RAMP CURVE

This application is a continuation of application Ser. No. 11/187,764, filed Jul. 21, 2005, status allowed.

TECHNICAL FIELD

The present invention relates generally to computer aided design ("CAD") tools and processes. More particularly, the present invention relates to a CAD tool for the modeling of machined parts.

BACKGROUND

Figure 1:
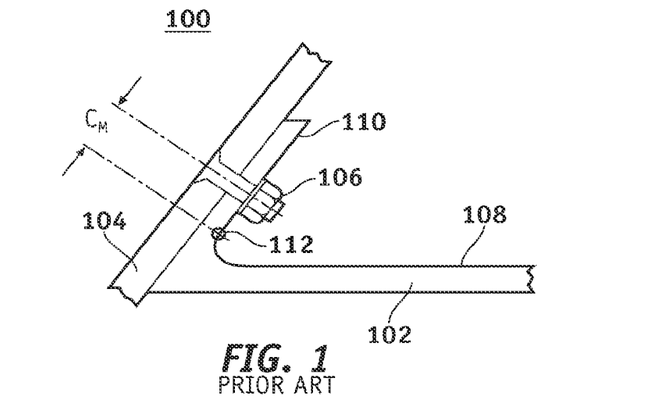
FIG. 1 is a cross sectional view of a flange joint as modeled without a cutter ramp curve.

A cutter ramp is a physical ramp or angled feature, located at the intersection of a machined flange pocket, that is created by the act of cutting an acute angle wall with a cylindrical cutting tool. FIG. 1 is a cross sectional view of a flange joint 100 as designed and modeled without a cutter ramp curve. Flange joint 100 includes a flanged component or part 102 and a component 104, which is attached to flanged part 102 with a fastener 106. Flanged part 102 includes a web face (or floor) 108 and an acute angle wall (or flange face) 110 extending from web face 108. The junction of web face 108 and acute angle wall 110 is modeled as a simple fillet having a tangent point 112 located on the face of acute angle wall 110. In a three dimensional model, this tangent point corresponds to a flange tangency edge or curve. The distance ($C_m$) between tangent point 112 and the longitudinal axis of fastener 106 represents the fastener clearance as modeled.

Figure 2:
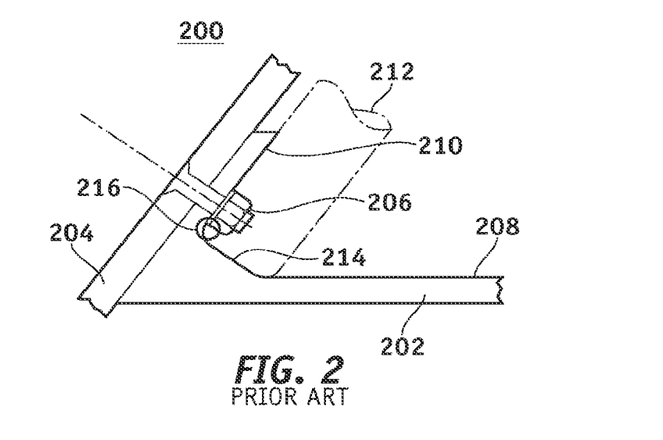
FIG. 2 is a cross sectional view of a flange joint modeled as depicted in FIG. 1, but machined with a cutter ramp curve.

FIG. 2 is a cross sectional view of a flange joint 200 modeled as described above in connection with FIG. 1, but machined in accordance with practical manufacturing techniques that produce a cutter ramp. Flange joint 200 includes a flanged component or part 202 and a component 204, which is attached to flanged part 202 with a fastener 206. Flange 202 includes a web face (or floor) 208 and an acute angle wall (or flange face) 210 extending from web face 208. Flanged part 202 is machined using a cutter 212, which is a cylindrical tool having a substantially flat tip with slightly radiused edges. As shown in FIG. 2, cutter 212 forms a cutter ramp 214 in the inner pocket of flange 202. Formation of cutter ramp 214 results in additional solid material remaining in the inner pocket of flanged part 202 in comparison to the ideal fillet modeled in FIG. 1. Notably, since flange joint 200 was modeled as flange joint 100, cutter ramp 214 interferes with the modeled location of fastener 206. This interference point is identified by reference number 216 in FIG. 2.

As illustrated by FIG. 1 and FIG. 2, the design of fastened joints can be hindered by the inability to economically model a cutter ramp in machined parts. For example, the absence of a cutter ramp on a CAD model can lead to the improper location of fastener patterns, typically manifested as short fastener clearances to edges. This condition is either corrected by re-design upon discovery or by analytical verification that the condition can be accepted in the final design. Both of these solutions can be time consuming and expensive to implement.

Accordingly, it is desirable to have an automated software tool that is capable of quickly modeling cutter ramps and cutter ramp tangent curves in machined parts. Furthermore, other desirable features and characteristics of the present invention will become apparent from the subsequent detailed description and the appended claims, taken in conjunction with the accompanying drawings and the foregoing technical field and background.

BRIEF SUMMARY

A method and computerized tool according to the invention models a cutter ramp curve on the acute angle wall of a flange, which may be relevant to proper fastener placement. The cutter ramp curve represents the location where a cutter ramp tool would be tangent to the flange face wall. The cutter ramp curve can be used by a designer to enhance the quality of the design of the fastened joint. An automated CAD tool as described herein reduces designer effort required to achieve such quality improvement.

The above and other aspects of the invention may be carried out in one form by a computerized method for automated modeling of a cutter ramp curve for a flange having a modeled geometry. The method comprises obtaining a first set of user inputs associated with a cutter tool to be used during machining of the flange, obtaining a second set of user inputs associated with the modeled geometry of the flange, generating a cutter diameter parameter in response to the first set of user inputs, and producing a modeled cutter ramp curve based upon the modeled geometry of the flange and the cutter diameter parameter.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that the present invention may be practiced in conjunction with any number of computer hardware implementations, computer aided design tools, and computerized modeling applications, and that the system described herein is merely one exemplary application for the invention.

For the sake of brevity, conventional techniques and aspects of computer devices, computer aided design applications, computer modeling applications, machining of parts, flange joint design, and other aspects of the system (and the individual operating components of the system) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

The various illustrative blocks, modules, processing logic, and circuits described in connection with the embodiments disclosed herein may be implemented or performed with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. A processor may be realized as a microprocessor, a controller, a microcontroller, or a state machine. A processor may also be implemented as a combination of computing devices, e.g., a combination of a digital signal processor and a microprocessor, a plurality of microprocessors, one or more microprocessors in conjunction with a digital signal processor core, or any other such configuration.

The steps and tasks of a method, process, or algorithm described in connection with the embodiments disclosed herein may be embodied directly in hardware, in firmware, in a software module executed by a processor, or in any practical combination thereof. A software module may reside in RAM memory, flash memory, ROM memory, EPROM memory, EEPROM memory, registers, a hard disk, a removable disk, a CD-ROM, or any other form of storage medium known in the art. In this regard, an exemplary storage medium can be coupled to a processor such that the processor can read information from, and write information to, the storage medium. In the alternative, the storage medium may be integral to the processor. As an example, the processor and the storage medium may reside in an ASIC.

The invention relates to automated computerized techniques for modeling a cutter ramp curve in a machined flange part. Such techniques may be carried out with any suitable computing device, system, or platform configured to support compatible CAD and/or modeling software applications. With regard to the physical computing hardware, one or more processors may communicate with system memory (e.g., a suitable amount of random access memory), and an appropriate amount of storage or "permanent" memory. The permanent memory may include one or more hard disks, floppy disks, CD-ROM, DVD-ROM, magnetic tape, removable media, solid state memory devices, or combinations thereof. In accordance with known techniques, the operating system programs and the application programs reside in the permanent memory and portions thereof may be loaded into the system memory during operation. In accordance with the practices of persons skilled in the art of computer programming, the present invention is described herein with reference to symbolic representations of operations that may be performed by the computing device, system, or platform. Such operations are sometimes referred to as being computer-executed, computerized, software-implemented, or computer-implemented. It will be appreciated that operations that are symbolically represented include the manipulation by the various microprocessor devices of electrical signals representing data bits at memory locations in the system memory, as well as other processing of signals. The memory locations where data bits are maintained are physical locations that have particular electrical, magnetic, optical, or organic properties corresponding to the data bits.

When implemented in software, various elements of the present invention are essentially the code segments or instructions that perform the various tasks. The program or code segments can be stored in a processor-readable medium or transmitted by a computer data signal embodied in a carrier wave over a transmission medium or communication path. The "processor-readable medium" or "machine-readable medium" may include any medium that can store or transfer information. Examples of the processor-readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, or the like. The computer data signal may include any signal that can propagate over a transmission medium such as electronic network channels, optical fibers, air, electromagnetic paths, or RF links. The code segments may be downloaded via computer networks such as the Internet, an intranet, a LAN, or the like.

Figure 4:
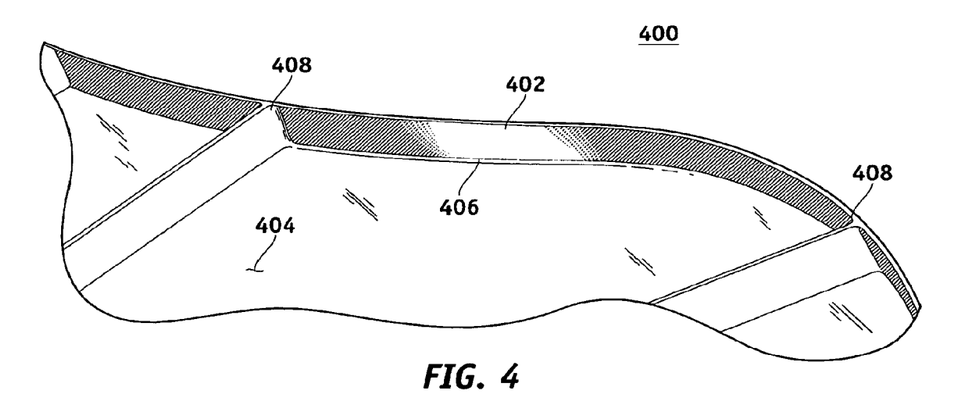
FIG. 4 is a perspective view of a flange as modeled without a cutter ramp curve.

A computerized method for automated modeling of a cutter ramp curve for a flange having a modeled geometry can be realized in connection with a suitable CAD system, such as a UNIGRAPHICS system running the KNOWLEDGE FUSION programming language. Such CAD systems utilize conventional construction geometry features to generate a computer model and representation of the desired part. FIG. 4 is a perspective view of a modeled flange part 400 as modeled without a cutter ramp curve; conventional CAD systems can model a flange in this manner. Modeled flange part 400 includes an angled flange face 402 that rises above a web face 404. As depicted here, modeled flange part 400 includes only a relatively small radius fillet 406 at the junction of flange face 402 and web face 404. Modeled flange part 400 also includes two corner blends 408 located adjacent to flange face 402. CAD systems typically model such corner blends with the designed corner blend radii.

Figure 3:
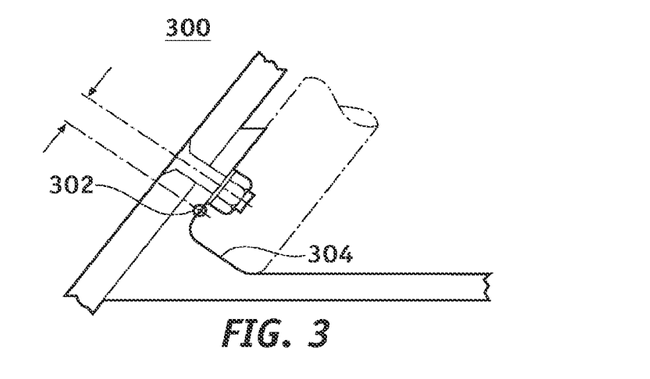
FIG. 3 is a cross sectional view of a flange joint as modeled and machined with a cutter ramp curve.
Figure 5:
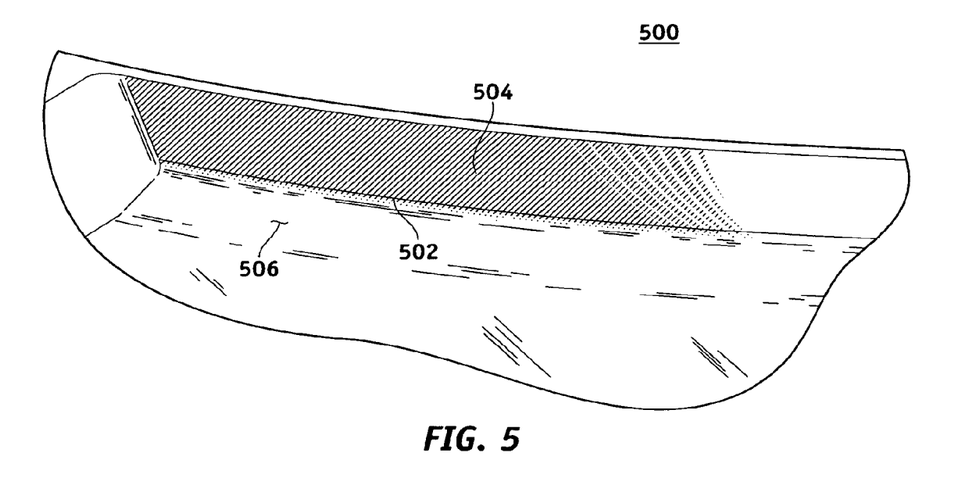
FIG. 5 is a perspective view of a flange as modeled with a cutter ramp curve.

FIG. 5, on the other hand, is a perspective view of a modeled flange 500 as modeled with a cutter ramp curve 502. As used herein, a "cutter ramp curve" is a curve that represents the tangency points of a machined fillet radius, as created by a cutter tool having a specified cutter diameter and a specified cutter fillet radius. In this regard, FIG. 3 is a cross sectional view of a flange joint 300 as modeled and machined with a cutter ramp curve. This two dimensional cross section depicts the cutter ramp curve as an intersection point 302, i.e., the point of tangency of the cutter fillet radius 304. The location of the cutter ramp curve provides a realistic guideline for purposes of fastener clearance in the machined flange joint. Referring again to FIG. 5, cutter ramp curve 502 corresponds to the tangency point of the cutter fillet radius, as traced along the extent of the flange face 504 of modeled flange 500. For purposes of illustration, FIG. 5 also depicts a cutter ramp 506, which is created during actual machining of the flange part. In a practical CAD system implementation, cutter ramp 506 need not be modeled nor rendered as shown in FIG. 5.

Briefly, a CAD tool that incorporates the techniques described herein is desirable because it quickly and automatically models the cutter ramp curve on the acute angle face wall, which is relevant to proper fastener placement. The user can select on screen geometry objects for use as input items. Enterprise rules for allowable cutter ramp geometry can be embedded into the system to ensure that mandatory design specifications are followed. Moreover, the modeling tool can utilize intelligent geometry recognition techniques to minimize the amount of user inputs. In one practical embodiment, the system allows the user to override enterprise design rules and prompts the user to provide an explanation or rationale for the override. Furthermore, associative modeling techniques can be employed to enable the cutter ramp curve to be automatically updated in response to modifications in the flange part model. Knowledge of the resultant cutter ramp curve location enables designers to provide increased quality in the design of the fastened flange joint, and the automated CAD tool dramatically reduces designer effort required to achieve this quality improvement.

Figure 6:
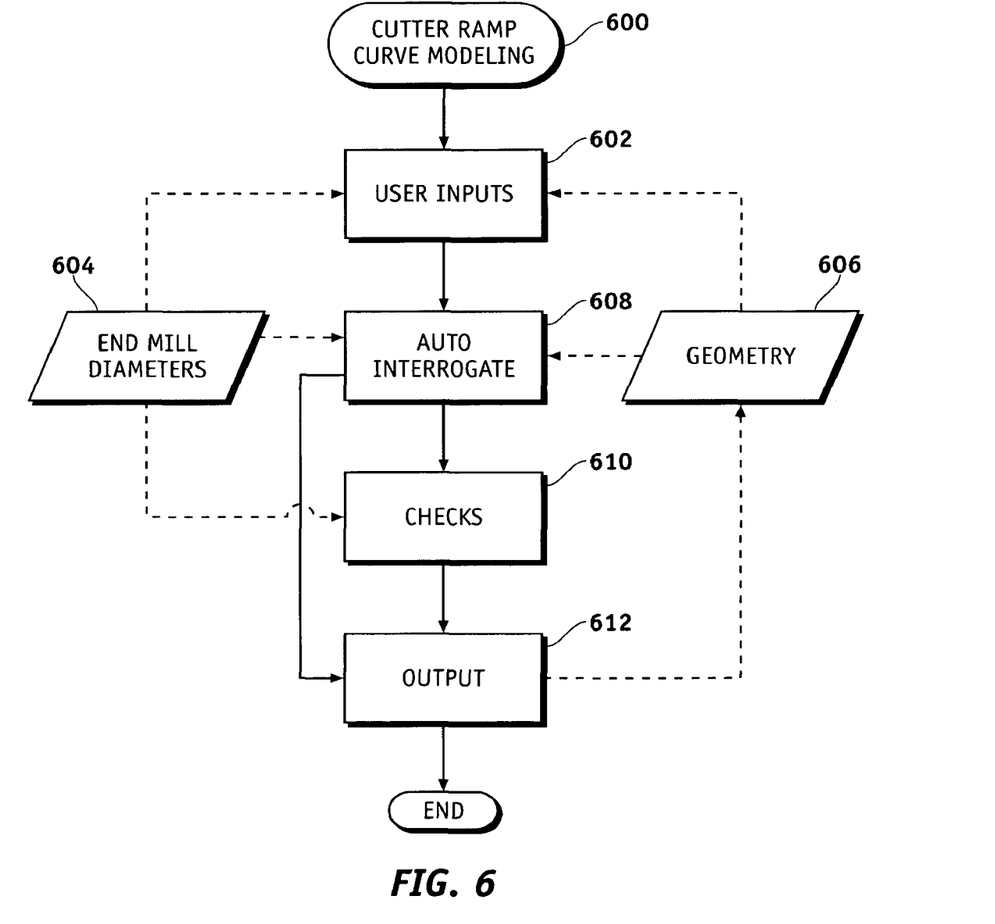
FIG. 6 is a flow chart of a cutter ramp curve modeling process according to an example embodiment of the invention.

FIG. 6 is a flow chart of a cutter ramp curve modeling process 600 according to an example embodiment of the invention. Process 600 may be performed by a suitable computer or computing device as described above. The various tasks performed in connection with process 600 (and the other processes, methods, and procedures depicted in FIGS. 7-11) may be performed by software, hardware, firmware, or any combination thereof. It should be appreciated that the processes may include any number of additional or alternative tasks, the tasks shown in FIGS. 6-11 need not be performed in the illustrated order, and the processes may be incorporated into a more comprehensive procedure or process having additional functionality not described in detail herein.

Cutter ramp curve modeling process 600 is performed after the basic geometry of the flange has been modeled. For example, a flange as depicted in FIG. 4 may be modeled by a suitable CAD system using conventional features, objects, and elements. In practice, process 600 may be initiated using a drop down menu selection or any graphical user interface feature. Process 600 may begin by collecting and/or processing user inputs (task 602) necessary for the generation of the cutter ramp curve. As depicted in FIG. 6, task 602 may access end mill diameter data 604 corresponding to common or standardized cutter tool diameters, and geometry data 606 corresponding to the geometry of the modeled flange. Although not a requirement of the invention, end mill diameter data 604 may include the following common diameters (in inches): 0.375; 0.500; 0.625; 0.750; 1.00; 1.25; 1.50; 1.75; and 2.00.

In response to the user inputs, process 600 may then perform an automatic interrogation of the modeled geometry (task 608) to find or identify corner blends adjacent to the subject flange face, and/or to find or identify other relevant features or characteristics of the modeled flange. Thus, as shown in FIG. 6, task 608 may access geometry data 606. In practice, task 608 may determine the diameter of the discovered corner blends. Thereafter, process 600 may verify or check whether the user input is consistent with the modeled geometry of the flange (task 610). For example, task 610 may compare the diameter of a corner blend to the diameter of a selected cutter diameter, or compare the modeled geometry to mandatory design requirements.

Eventually, cutter ramp curve modeling process 600 generates a cutter ramp curve as an output (task 612). Briefly, task 612 processes the user inputs and the geometry data 606 to automatically generate a modeled cutter ramp curve. In particular, task 612 produces a modeled cutter ramp curve based upon the modeled geometry of the flange and a cutter diameter parameter (which may be a user-entered value or a value generated by process 600). In a practical CAD system, process 600 renders the cutter ramp curve in a suitable manner for display on a computer monitor or other display device.

Figure 7:
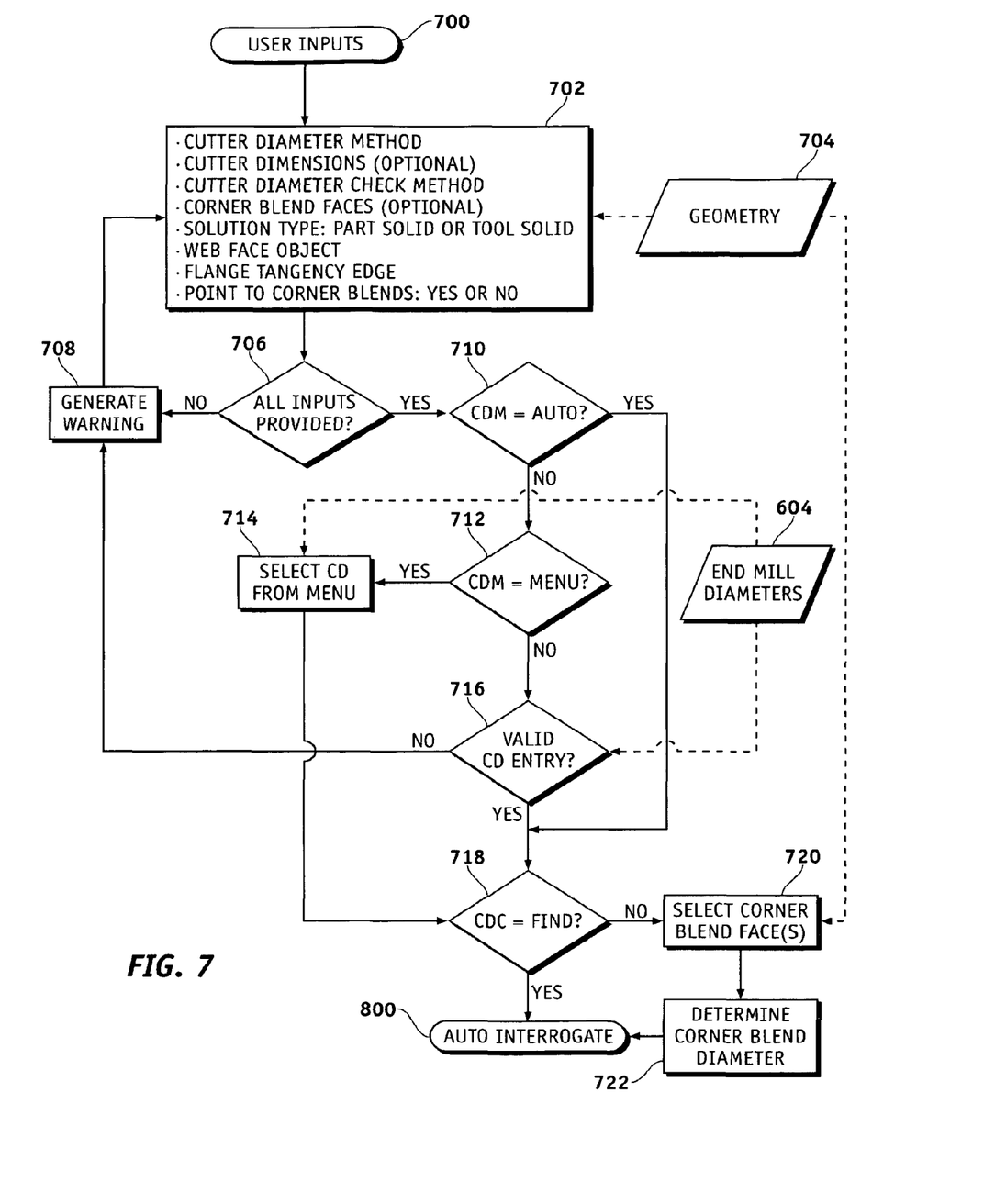
FIG. 7 is a flow chart of a user inputs procedure suitable for use in the cutter ramp curve modeling process depicted in FIG. 6.

FIG. 7 is a flow chart of a user inputs procedure 700 suitable for use in cutter ramp curve modeling process 600. In a practical embodiment, portions of procedure 700 may involve the user, while other portions of procedure 700 may be automated. Procedure 700 begins by obtaining a number of user inputs (702) in any order, some of which may be optional. In this example, user inputs 702 include at least a first set of user inputs associated with a cutter tool to be used during machining of the flange, and a second set of user inputs associated with the modeled geometry of the flange. In this regard, procedure 700 may access geometry data 704 corresponding to the modeled geometry of the flange.

The first set of user inputs may include one or more of the following, without limitation: a selected cutter diameter determination method; cutter dimensions (e.g., a cutter diameter value, a cutter fillet radius value, a cutter diameter value, or the like); and a selected cutter diameter check method. The second set of user inputs may include one or more of the following, without limitation: corner blend faces of the flange; a web face object; a flange tangency edge; a flange face object; the initially modeled fillet face; corner blend geometry; or the like. It should be appreciated that one or more inputs may be derived by the system from other inputs. For example, any two of the following inputs can be used to derive the third input: flange face object; web face object; flange tangency edge.

In accordance with one practical embodiment of the invention, the user is presented with a graphical user interface that allows the user to select a desired cutter diameter determination method, including, without limitation: an automatic method; a menu selection method; and a user entry method. In response to the selected method, the system generates a suitable cutter diameter parameter for use when modeling the cutter ramp curve. The automatic method causes the system to automatically generate the cutter diameter parameter based upon the corner blend geometry of the flange (described in more detail below). The menu selection method causes the system to activate or display a selectable menu of cutter diameter values, thus allowing the user to select one of the available cutter diameter values. The user entry method causes the system to activate or display a user entry field, thus allowing the user to key in a cutter diameter value. The selected or keyed in cutter diameter value corresponds to the cutter diameter parameter described above.

The graphical user interface may also enable the user to select a desired cutter diameter check method, including, without limitation: an automated corner blend find method; and a user selection method. As described in more detail below, the system may use the selected cutter diameter check method to identify a corner blend adjacent to the flange face object in question to verify whether the current cutter diameter parameter is consistent with the modeled geometry of the corner blend. The "find" method causes the system to automatically find the corner blends by interrogating and analyzing the modeled flange geometry. The "select" method allows the user to select or identify the blend faces to be used for checking the cutter diameter (described in more detail below).

In the example embodiment, the graphical user interface allows the user to select the solution type for the model. The solution type may represent the part solid (i.e., the positive solution) or the tool solid (i.e., the negative solution). In this regard, using the tool solid will keep the cutter ramp curve independent of the subtraction features used to create the part solid, which will avoid deletion of cutter ramp curves if the subtraction features are deleted. In addition, the graphical user interface may allow the user to select the web face object and the flange tangency edge object. In practice, such selection can be performed by pointing to and selecting the respective object as rendered on the display. The graphical user interface may also allow the user to select whether the model should include pointers to corner blends. The pointers are rendered as arrows, cones, or other objects that indicate the faces that were used to determine the cutter diameter parameter.

After the user enters the data, procedure 700 tests whether all of the necessary inputs have been provided (query task 706). If not, then the application generates and renders a suitable warning for the user (task 708), and procedure 700 returns to gather the additional data input 702. If the set of inputs is acceptable, then procedure 700 follows different paths depending upon the selected cutter diameter method ("CDM"). For example, if the automatic CDM was selected (query task 710), then user inputs procedure 700 proceeds to a query task 718. If the menu driven CDM was selected (query task 712), then the user is prompted to select a desired cutter diameter ("CD") from a drop down menu (task 714). Following task 714, procedure 700 proceeds to query task 718. If, however, the key-in CDM was selected, then the system may check whether the entered CD is valid (query task 716). In this example embodiment, query task 716 verifies whether the entered CD is consistent with a stored database of available end mill diameters. In other words, query task 716 checks to ensure that the user has entered a cutter diameter that corresponds to an available cutter tool that can be used to machine the flange part. If the entered CD is invalid, then task 708 may be performed to generate a suitable warning and/or to prompt the user to enter a different CD value. If the entered CD is valid, then procedure 700 proceeds to query task 718. Alternatively, a practical embodiment may accept non-standard cutter diameters and accept whatever CD is keyed in by the user. Consequently, such an alternate embodiment need not perform the validation associated with query task 716.

Query task 718 tests whether the selected cutter diameter check ("CDC") method is the "find" method. If so, then user inputs procedure 700 can end or prompt an auto interrogate procedure 800. If, however, the CDC method is the "select" method, then the system may prompt the user to select one or more corner blend faces (task 720). Task 720 may access the modeled geometry data for the modeled flange, as described above. In response to the selected corner blend faces, the application determines the respective corner blend radius/radii (task 722). In practice, a flange face will have either zero, one, or two adjacent corner blends, and procedure 700 contemplates these possibilities. Following task 722, procedure 700 may end or lead to auto interrogate procedure 800.

Figure 8:
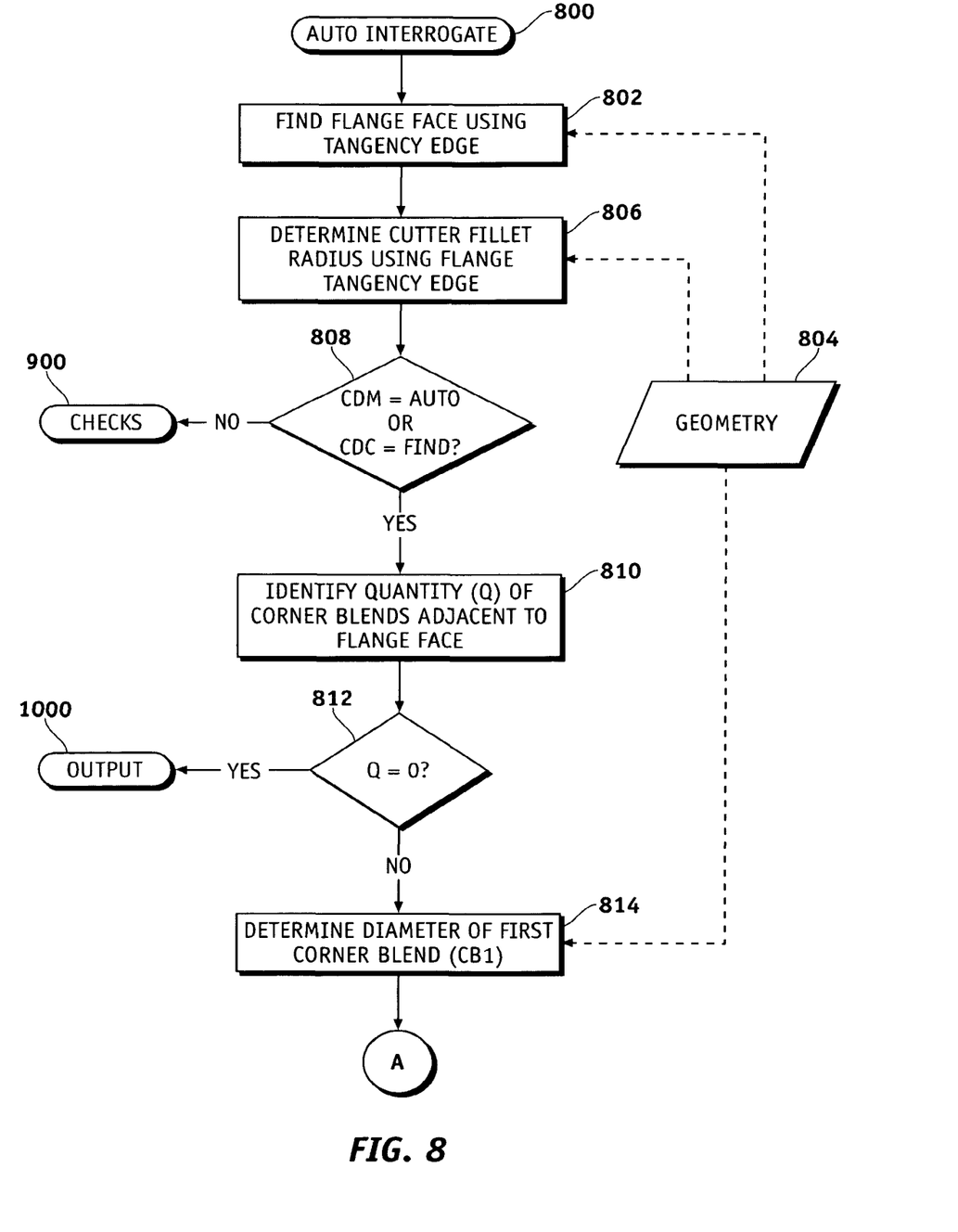
FIGS. 8 and 9 depict a flow chart of an auto interrogate procedure suitable for use in the cutter ramp curve modeling process depicted in FIG. 6.
Figure 9:
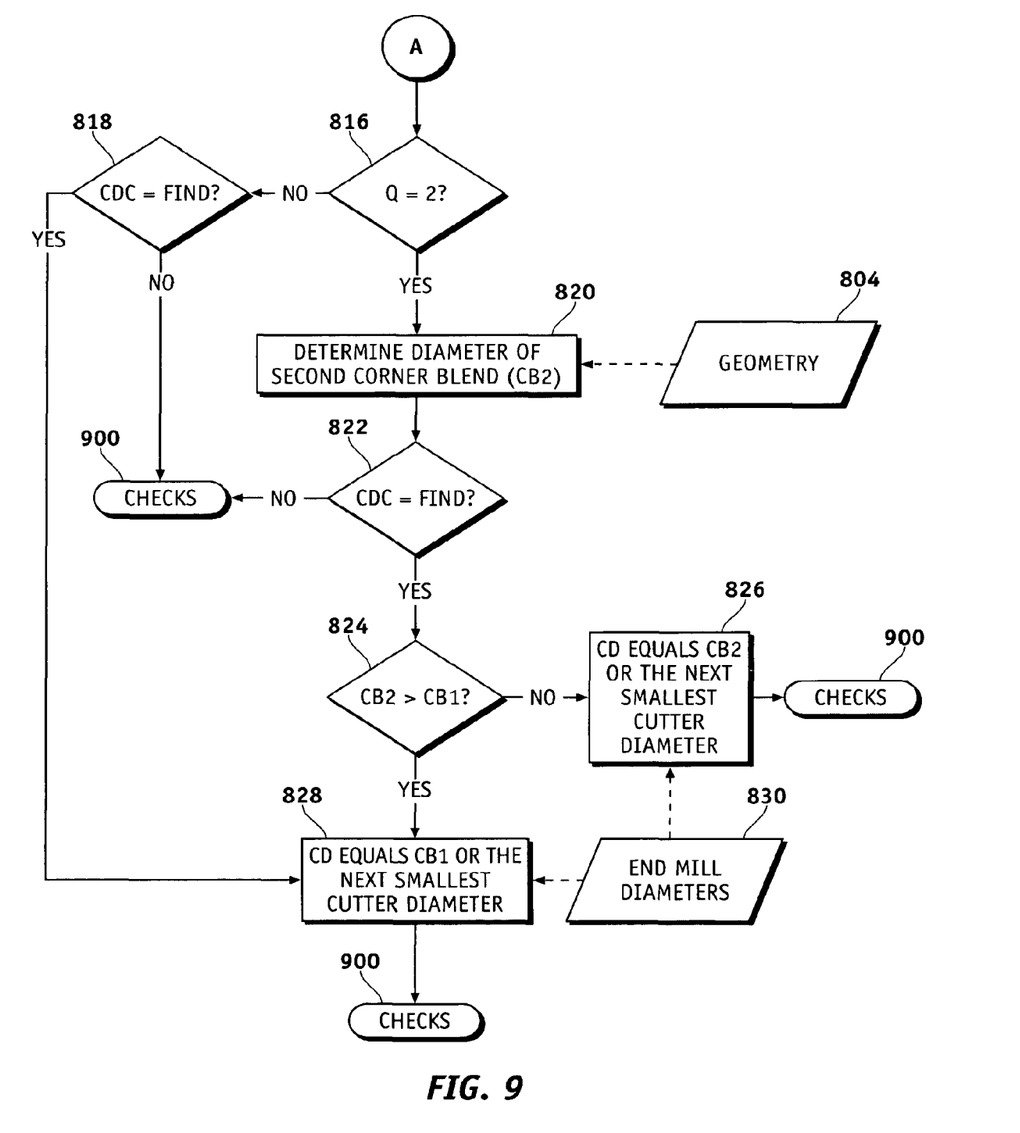

FIGS. 8 and 9 depict a flow chart of an auto interrogate procedure 800 suitable for use in cutter ramp curve modeling process 600. Procedure 800 may begin by finding a flange face object using the flange tangency edge object selected by the user (task 802). In this regard, the found flange face is based upon the selected flange tangency edge. In a practical implementation, task 802 may access geometry data 804 and task 802 may utilize one or more geometric rules to determine the flange face. In addition, procedure 800 determines the cutter fillet radius using the flange tangency edge object (task 806). In a practical implementation, task 806 may access geometry data 804 and task 806 may utilize one or more geometric rules to determine the cutter fillet radius.

If the cutter diameter determination method is the "automatic" method or if the cutter diameter check method is the "find" method (query task 808), then auto interrogate procedure 800 identifies the quantity ("Q") of corner blends adjacent to the given flange face (task 810). As mentioned above, Q can be zero, one, or two in a practical embodiment. A negative response to query task 808 causes procedure 800 to end or to initiate a checks procedure 900 (described below). The checks procedure is prompted at this time because the bulk of the auto interrogation tasks need not be performed if the user has already selected or entered specific values for the cutter diameter and/or the corner blends.

If the quantity of corner blends is zero (query task 812), then auto interrogation procedure 800 ends, or it initiates an output procedure 1000 (described below). Output procedure 1000 can be initiated here because the model need not consider potential dimensional conflicts for the cutter diameter in the absence of corner blends. If at least one corner blend has been identified, however, then the system performs a task 814 to determine the diameter of the first corner blend ("CB1"), based upon geometry data 804. If the quantity of corner blends is one (query task 816), then procedure 800 tests whether the cutter diameter check method is the "find" method (query task 818). If not, then procedure 800 ends, or it initiates the checks procedure 900. If so, then procedure 800 may proceed to a task 828 (described below). If, however, the quantity of corner blends is two (query task 816), then procedure 800 may proceed to a task 820.

During task 820 the system determines the diameter of the second corner blend ("CB2"), based upon geometry data 804. In addition, the system may test whether the cutter diameter check method is the "find" method (query task 822). If not, then procedure 800 ends, or it initiates the checks procedure 900. If so, then procedure 800 may test whether the CB2 diameter is greater than the CB1 diameter (query task 824). If CB2 is not greater than CB1, then the system designates the cutter diameter to be equal to the diameter corresponding to CB2, or the next smallest available cutter diameter (task 826). The next smallest cutter diameter may need to be selected if the diameter corresponding to CB2 does not match one of the end mill diameters 830 maintained by the system. After the cutter diameter parameter has been determined, procedure 800 may end, or it may initiate the checks procedure 900.

If, however, CB2 is greater than CB1, then the system designates the cutter diameter to be equal to the diameter corresponding to CB1, or the next smallest available cutter diameter (task 828). The next smallest cutter diameter may need to be selected if the diameter corresponding to CB1 does not match one of the end mill diameters 830 maintained by the system. After the cutter diameter parameter has been determined, procedure 800 may end, or it may initiate the checks procedure 900. In practice, the comparison of the corner blend geometries results in the identification of a cutter diameter that is compatible with the smallest of the two corner blends (with the assumption that a corner blend having a relatively large radius can be created using a cutter tool having a smaller radius). Upon completion of auto interrogate procedure 800, the system is ready to process the selected or determined cutter diameter parameter using the checks procedure 900.

Figure 10:
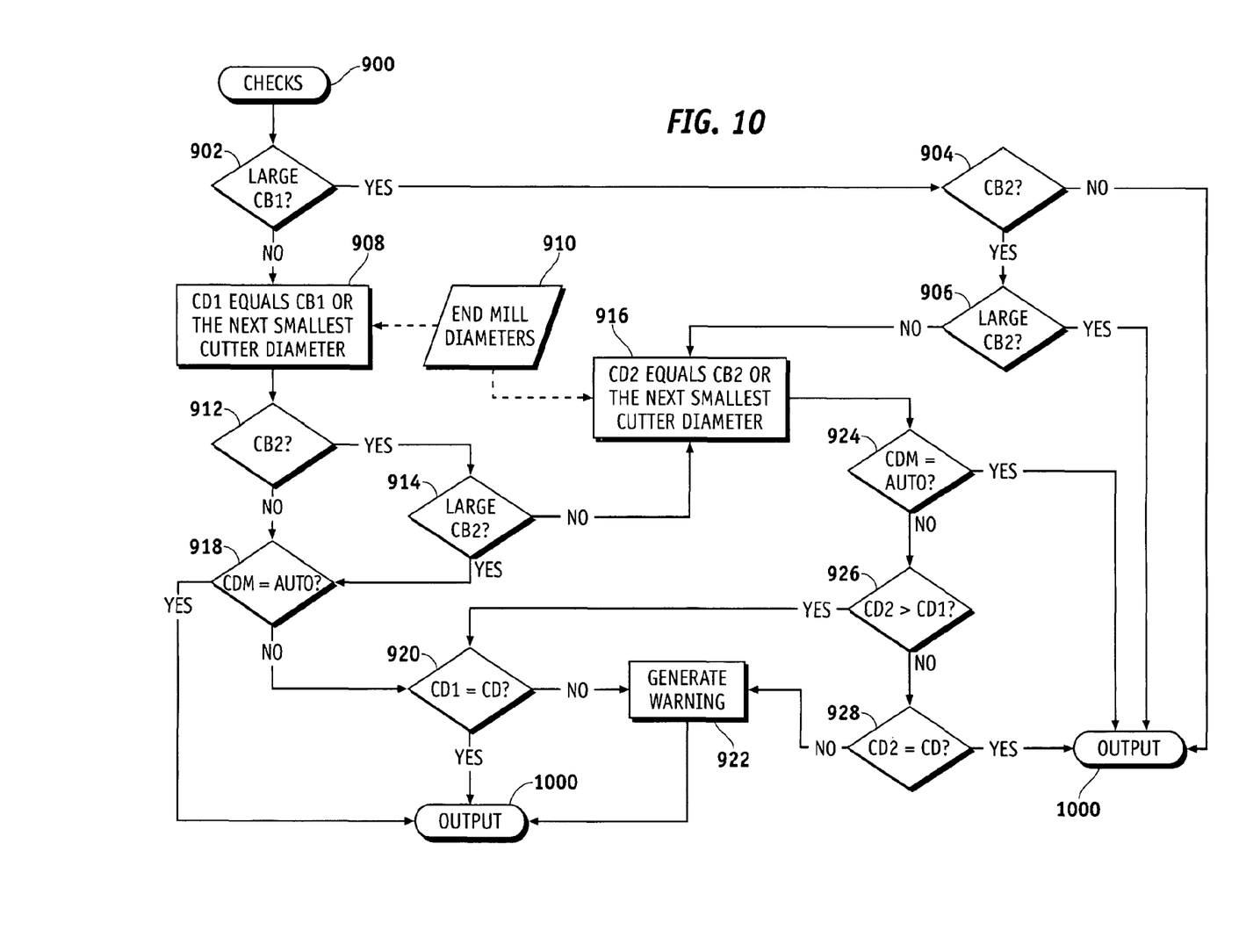
FIG. 10 is a flow chart of a checks procedure suitable for use in the cutter ramp curve modeling process depicted in FIG. 6.

FIG. 10 is a flow chart of a checks procedure 900 suitable for use in cutter ramp curve modeling process 600. Procedure 900 may begin by determining whether the diameter of the first corner blend is "large" (query task 902). As used herein, a corner blend is defined to be large if: (1) the cutter diameter determination method is "automatic" and the diameter of the corner blend is greater than or equal to one inch; or (2) the cutter diameter check method is "select" and the diameter of the cutter blend is greater than or equal to two inches; or (3) the cutter diameter determination method is "menu" and the diameter of the cutter blend is greater than or equal to two inches; or (4) the cutter diameter determination method is "key in" and the user-entered cutter diameter is greater than or equal to ten inches. If CB1 is large according to this definition, then procedure 900 checks whether a second corner blend exists (query task 904). If not, then procedure 900 ends, or it initiates the output procedure 1000 (described below). If a second corner blend exists, then the system checks whether CB2 is large as defined above (query task 906). If CB2 is large, the procedure 900 ends, or it initiates output procedure 1000. In other words, if both corner blends are large, then the system assumes that the identified cutter diameter will be small enough to create both corner blends and the system assumes that the identified cutter diameter is consistent with the modeled geometry of the flange. If, however, query task 906 determines that CB2 is not large, then procedure 900 leads to a task 916 (described below).

If query task 902 determines that CB1 is not large, then the system designates a first cutter diameter ("CD1") to be equal to the diameter corresponding to CB1, or the next smallest available cutter diameter (task 908). The next smallest cutter diameter may need to be selected if the diameter corresponding to CB1 does not match one of the end mill diameters 910 maintained by the system. Checks procedure 900 proceeds to check whether a second corner blend exists (query task 912). If so, then the system checks whether CB2 is large as defined above (query task 914). If CB2 is not large, then query task 914 leads to task 916. Accordingly, task 916 is performed when a "small" second corner blend exists.

If query task 914 determines that CB2 is large, or if query task 912 determines that no CB2 exists, than checks procedure 900 may check whether the selected cutter diameter determination method is "automatic" (query task 918). If so, then procedure 900 ends, or it initiates output procedure 1000. If not, then the application tests whether the designated CD1 value equals the desired cutter diameter ("CD"), which has been selected or entered by the user (query task 920). If CD1=CD, then checks procedure 900 ends, or it initiates output procedure 1000. In other words, the system has confirmed that the desired cutter diameter is consistent with the modeled corner blend geometry. On the other hand, if the comparison of CD1 to CD results in an inequality, then the system may generate a suitable warning for the user (task 922). This warning informs the user that that desired cutter diameter is inconsistent with the modeled flange geometry. The warning may be realized as a pop up window rendered on the display device, and the warning can include any suitable text that informs the user of the inconsistency. Furthermore, the system may prompt the user to provide an explanation for the inconsistency. In this example, even after providing such a warning, procedure 900 initiates output procedure 1000.

As mentioned above, task 916 is performed when a "small" second corner blend is discovered by the system. Task 916 designates a second cutter diameter ("CD2") to be equal to the diameter corresponding to CB2, or the next smallest available cutter diameter. The next smallest cutter diameter may need to be selected if the diameter corresponding to CB2 does not match one of the end mill diameters 910 maintained by the system. After designating the CD2 parameter, checks procedure 900 may check whether the selected cutter diameter determination method is "automatic" (query task 924). If so, then procedure 900 ends, or it initiates output procedure 1000. If not, then the system compares CD1 to CD2 (query task 926). If CD2 is greater than CD1, then procedure 900 leads to query task 920 to continue as described above. If, however, CD2 is not greater than CD1, then the system tests whether the designated CD2 value equals the desired cutter diameter, which has been selected or entered by the user (query task 928). If CD2=CD, then checks procedure 900 ends, or it initiates output procedure 1000. In other words, the system has confirmed that the desired cutter diameter is consistent with the modeled corner blend geometry. On the other hand, if the comparison of CD2 to CD results in an inequality, then procedure 900 leads to task 922 to continue as described above.

Figure 11:
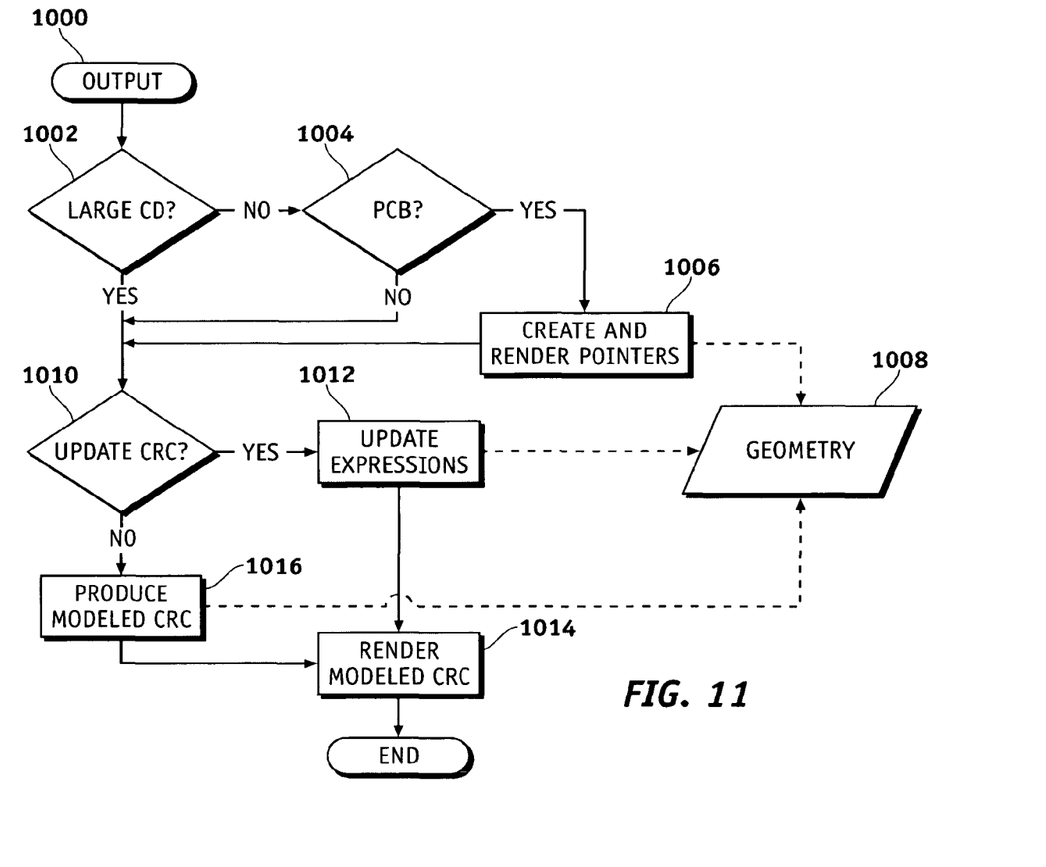
FIG. 11 is a flow chart of an output procedure suitable for use in the cutter ramp curve modeling process depicted in FIG. 6.

FIG. 11 is a flow chart of an output procedure 1000 suitable for use in cutter ramp curve modeling process 600. Process 1000 may begin by checking whether the CD is "large" (query task 1002). As used herein, the CD is large if: (1) the cutter diameter determination method is "automatic" and the CD is greater than or equal to one inch; or (2) the cutter diameter check method is "select" and the CD is greater than two inches; or (3) the cutter diameter determination method is "menu" and the CD is equal to two inches; or (4) the cutter diameter determination method is "key in" and the CD is greater than or equal to ten inches. Of course, a practical implementation may employ any suitable criteria or definition of "large" in this context. If the CD is not large according to this definition, then procedure 1000 checks whether the option of pointing to corner blends ("PCB") has been selected (query task 1004). If so, then the system proceeds to create and render suitable corner blend pointers (task 1006) corresponding to the corner blends associated with the determination of the cutter diameter. As depicted in FIG. 11, task 1006 may generate suitable geometry data 1008 that represents the pointers.

If query task 1004 determines that the PCB option was not selected, or if query task 1002 determines that the CD is large, output procedure 1000 proceeds to a query task 1010, which tests whether the current processing iteration will update an existing cutter ramp curve ("CRC"). In this regard, the system is suitably configured to automatically update a cutter ramp curve in response to changes in the modeled flange geometry and/or changes to the user inputs. If procedure 1000 is updating an existing CRC, then task 1012 may be performed to update the existing expressions. As depicted in FIG. 11, task 1012 may also update geometry data 1008 as necessary. The updated expressions may be utilized to update the CRC modeling, thus enabling the system to render the updated CRC in a suitable manner (task 1014).

If the current processing relates to a new CRC model rather than an update to an existing CRC model, then output procedure 1000 will produce the modeled cutter ramp curve based upon the modeled geometry of the flange and the cutter diameter parameter (task 1016). As shown in FIG. 11, task 1016 may update geometry data 1008 with the cutter ramp model. In the practical embodiment, task 1016 creates the cutter ramp curve using the CD value, the selected solution type, the cutter fillet radius, the selected web face object, the determined flange face object, and cutter clearance rules. Thus, the characteristics of the modeled cutter ramp curve will be dependent upon the flange face object, the web face object, the cutter diameter, and the like. Thereafter, the modeled cutter ramp curve can be rendered for display on a suitable monitor or display terminal (task 1014). In accordance with one example embodiment, the cutter ramp curve is rendered by projecting a curve onto the modeled flange face for the flange part (see, for example, FIG. 4 or FIG. 5). In practice, the modeled cutter ramp curve will initially be shown with the modeled flange part. After the curve has been created, however, the cutter ramp curve may be organized in a manner to show or not show when desired using the existing functionality of the CAD software.

Figure 12:
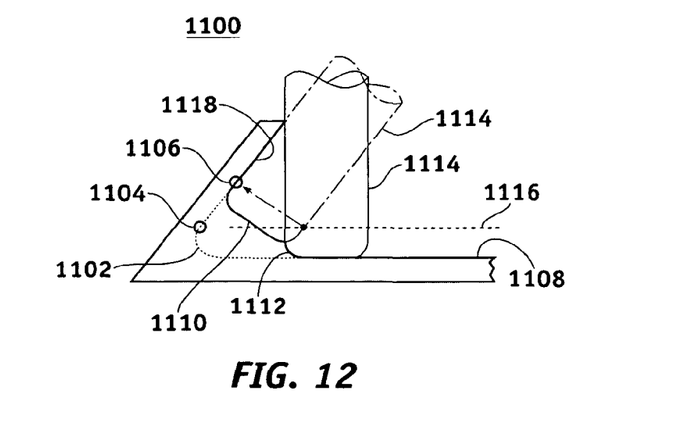
FIG. 12 is a combined cross sectional view of a flange as modeled and as machined with a cutter ramp curve.

The modeling of the cutter ramp curve itself may utilize any suitable technique. One example technique will be described with reference to FIG. 12, which is a combined cross sectional view of a flange 1100 as modeled and as machined with a cutter ramp curve. The dashed curve 1102 represents how flange 1100 is modeled—the model includes the flange tangency edge 1104 and the cutter ramp curve 1106. The solid outline of flange 1100 represents that which is actually machined. The machined flange 1100 includes a web face 1108, a cutter ramp 1110, and an additional fillet 1112. Fillet 1112 is created because the cutter tool cannot extend cutter ramp 1110 fully into the flanged pocket without possibly damaging the web face. FIG. 12 also depicts the cutting end of a cutter tool 1114 as it forms cutter ramp 1110.

In this example, cutter ramp curve 1106 can be modeled as follows. First, the system models a curve that passes through the center of one fillet radius of the end of cutter tool 1114. The curve is created by the intersection of an offset surface of the web face and an offset surface of the flange face. This curve will always remain the specified distance off web face 1108 and flange face 1118. In this example, the web distance is the fillet radius of cutter tool 1114 plus the cutter clearance rule distance that cutter tool 1114 will stay off the web face 1108. This offset distance is indicated by the dashed line 1116 in FIG. 12. The flange distance is the diameter of the cutter tool 1114 less the radius of the cutter fillet 1112. This curve is then projected onto the flange face to create cutter ramp curve 1006.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A computerized method for automated modeling of a cutter ramp curve for a flange having a modeled geometry, said method comprising:
    obtaining a first set of user inputs associated with a cutter tool to be used during machining of the flange, wherein obtaining said first set of user inputs comprises obtaining a cutter diameter determination method;
    obtaining a second set of user inputs associated with the modeled geometry of the flange;
    generating, using a processor, a cutter diameter parameter in response to said first set of user inputs; and
    producing, using the processor, a modeled cutter ramp curve based upon the modeled geometry of the flange and said cutter diameter parameter; and
    storing the modeled cutter ramp curve in a non-transitory computer readable storage medium.

2. The computerized method according to claim 1, further comprising rendering said modeled cutter ramp curve for display.

3. The computerized method according to claim 2, wherein rendering said modeled cutter ramp curve comprises projecting said cutter ramp curve onto a modeled flange face for the flange.

4. The computerized method according to claim 1, further comprising verifying whether said cutter diameter parameter is consistent with the modeled geometry of the flange.

5. The computerized method according to claim 1, wherein the flange has a flange face and a web face, and obtaining said second set of user inputs comprises obtaining a web face object and a flange face object.

6. The computerized method according to claim 1, wherein obtaining said second set of user inputs comprises obtaining a flange tangency edge.

7. The computerized method according to claim 1, wherein obtaining said first set of user inputs comprises obtaining a cutter diameter value, and said cutter diameter parameter corresponds to said cutter diameter value.

8. A computerized method for automated modeling of a cutter ramp curve for a flange having a modeled geometry, said method comprising:
    identifying a flange face object for the flange, a web face object for the flange, and a corner blend geometry for a corner of the flange;
    generating, using a processor, a cutter diameter parameter in response to at least one user input;
    verifying, using the processor, whether said cutter diameter parameter is consistent with said corner blend geometry;
    producing, using the processor, a modeled cutter ramp curve that is dependent upon said flange face object, said web face object, and said cutter diameter parameter; and
    storing the modeled cutter ramp curve on a non-transitory computer readable storage medium.

9. The computerized method according to claim 8, further comprising selecting a cutter diameter determination method.

10. The computerized method according to claim 9, said cutter diameter determination method comprising one of: an automatic method, a menu selection method, a user entry method.

11. The computerized method according to claim 8, further comprising selecting a cutter diameter check method.

12. The computerized method according to claim 11, said cutter diameter check method comprising one of: an automated corner blend find method, a user selection method.

13. The computerized method according to claim 8, wherein verifying whether said cutter diameter parameter is consistent with said corner blend geometry comprises:
    comparing said cutter diameter parameter to a corner blend radius specified in said corner blend geometry.

14. The computerized method according to claim 8, further comprising rendering said modeled cutter ramp curve for display.

15. The computerized method according to claim 14, wherein rendering said modeled cutter ramp curve comprises projecting said cutter ramp curve onto said flange face object.

16. A computerized method for automated modeling of a cutter ramp curve for a flange having a modeled geometry, said method comprising:
- obtaining a cutter diameter determination method;
- identifying a web face object in the modeled geometry;
- identifying a flange tangency edge object in the modeled geometry;
- generating, using a processor, a cutter diameter parameter using said cutter diameter determination method;
- finding, using the processor, a flange face object based upon said flange tangency edge object;
- producing, using the processor, a modeled cutter ramp curve based upon said flange face object, said web face object, and said cutter diameter parameter; and
- storing the modeled cutter ramp curve on a non-transitory computer readable storage medium.

17. The computerized method according to claim 16, further comprising:
- obtaining a cutter diameter check method;
- identifying, using said cutter diameter check method, a corner blend adjacent to said flange face object; and
- verifying whether said cutter diameter parameter is consistent with modeled geometry of said corner blend.

18. The computerized method according to claim 17, further comprising generating a warning if said cutter diameter parameter is inconsistent with modeled geometry of said corner blend.

* * * * *